United States Patent [19]
Fleege et al.

[11] Patent Number: 5,946,179
[45] Date of Patent: Aug. 31, 1999

[54] ELECTRONICALLY CONTROLLED CIRCUIT BREAKER WITH INTEGRATED LATCH TRIPPING

[75] Inventors: Dennis W. Fleege; Andy Allen Haun, both of Cedar Rapids, Iowa

[73] Assignee: Square D Company, Palatine, Ill.

[21] Appl. No.: 08/827,031

[22] Filed: Mar. 25, 1997

[51] Int. Cl.$^6$ .................................................. H02H 3/00
[52] U.S. Cl. ................................................ 361/93; 361/42
[58] Field of Search ................................. 361/42, 51, 54, 361/57, 58, 87, 93, 94, 99, 102, 114, 115; 335/21, 22, 23, 164, 166, 167, 170, 171, 172, 173, 174, 250, 251, 255, 18

[56] References Cited

U.S. PATENT DOCUMENTS

| H536 | 10/1988 | Strickland et al. | 324/456 |
|---|---|---|---|
| Re. 30,678 | 7/1981 | Van Zeeland et al. | 361/44 |
| 2,808,566 | 10/1957 | Douma | 324/127 |
| 2,832,642 | 4/1958 | Lennox | 299/132 |
| 2,898,420 | 8/1959 | Kuze | 335/18 |
| 3,471,784 | 10/1969 | Arndt et al. | 324/126 |
| 3,538,241 | 11/1970 | Rein | 174/143 |
| 3,588,611 | 6/1971 | Lambden et al. | 317/31 |

(List continued on next page.)

FOREIGN PATENT DOCUMENTS

| 0 615 327 | 9/1994 | European Pat. Off. | H02H 1/00 |
|---|---|---|---|
| 0 649 207 A1 | 4/1995 | European Pat. Off. | H02H 3/04 |
| 0 762 591 A2 | 3/1997 | European Pat. Off. | H02H 3/33 |
| 0 802 602 A2 | 10/1997 | European Pat. Off. | H02H 1/00 |
| 0813281 | 12/1997 | European Pat. Off. | H02H 3/00 |
| WO 97/30501 | 8/1997 | WIPO | H02H 1/00 |

OTHER PUBLICATIONS

Antonio N. Paolantonio, P.E., Directional Couplers, R.F. Design, Sep./Oct., 1979, pp. 40–49.
Alejandro Duenas, J., Directional Coupler Design Graphs For Parallel Coupled Lines and Interdigitated3 dB Couplers, RF Design, Feb., 1986, pp. 62–64.
RV4145 Low Power Ground Fault Interrupter, Preliminary Product Specifications of Integrated Circuits Raytheon Company Semiconductor Division, 350 Ellis Street, Mountain View CA 94309–7016, pp. 1–18. No Date.
Jean–Francois Joubert, Feasibility of Main Service Ground–Fault Protection On The Electrical Service To Dwelling Units, Consultants Electro–ProtectionIns., 1980, Michelin St., Laval, Quebec H7L 9Z7. Oct. 26, 1990, pp. 1–77.
R.D. Russell, Detection Of Arcing Faults On Distribution Feeders, Texas A & M Research Foundation, Box H. College Station, Texas 77843, Final Report Dec., 1982, pp. 1–B18.

*Primary Examiner*—Ronald W. Leja
*Attorney, Agent, or Firm*—Kareem M. Irfan; Larry I. Golden

[57] ABSTRACT

A circuit breaker for interrupting electrical current flowing through a line conductor to a load terminal in response to the detection of a current overload, ground fault and/or arcing fault. The circuit breaker has a trip circuit to generate a trip signal, a releasably latchable trip lever, and a latching mechanism. The trip lever is moveable between a latched position and a tripped position. In the latched position, the trip lever engages the latching mechanism and the electrical current flows through said circuit breaker. When a fault is detected by the trip circuit, a trip signal is send to the latching mechanism. Upon receiving the trip signal, the latching mechanism disengages the trip lever allowing the trip lever to slide into the tripped position and interrupting the current flow through the circuit breaker.

27 Claims, 7 Drawing Sheets

OTHER PUBLICATIONS

| Number | Date | Inventor | Class |
|---|---|---|---|
| 3,600,502 | 8/1971 | Wagenaar et al. | 174/143 |
| 3,622,872 | 11/1971 | Boaz et al. | 324/52 |
| 3,684,955 | 8/1972 | Adams | 324/72 |
| 3,746,930 | 7/1973 | Van Best et al. | 317/31 |
| 3,775,675 | 11/1973 | Freeze et al. | 324/51 |
| 3,812,337 | 5/1974 | Crosley | 235/153 AC |
| 3,858,130 | 12/1974 | Misencik | 335/18 |
| 3,869,665 | 3/1975 | Kenmochi et al. | 324/72 |
| 3,878,460 | 4/1975 | Nimmersjo | 324/52 |
| 3,911,323 | 10/1975 | Wilson et al. | 317/18 |
| 3,914,667 | 10/1975 | Waldron | 317/36 |
| 3,932,790 | 1/1976 | Muchnick | 317/18 D |
| 3,939,410 | 2/1976 | Bitsch et al. | 324/72 |
| 4,052,751 | 10/1977 | Shepard | 361/50 |
| 4,074,193 | 2/1978 | Kohler | 324/126 |
| 4,081,852 | 3/1978 | Coley et al. | 361/45 |
| 4,087,744 | 5/1978 | Olsen | 324/51 |
| 4,156,846 | 5/1979 | Harrold et al. | 324/158 |
| 4,169,260 | 9/1979 | Bayer | 340/562 |
| 4,214,210 | 7/1980 | O'Shea | 455/282 |
| 4,245,187 | 1/1981 | Wagner et al. | 324/54 |
| 4,251,846 | 2/1981 | Pearson et al. | 361/30 |
| 4,264,856 | 4/1981 | Frierdich et al. | 322/25 |
| 4,316,187 | 2/1982 | Spencer | 340/664 |
| 4,354,154 | 10/1982 | Schiemann | 324/126 |
| 4,356,443 | 10/1982 | Emery | 324/51 |
| 4,387,336 | 6/1983 | Joy et al. | 324/51 |
| 4,459,576 | 7/1984 | Fox et al. | 336/84 |
| 4,466,071 | 8/1984 | Russell, Jr. | 364/492 |
| 4,616,200 | 10/1986 | Fixemer et al. | 335/35 |
| 4,639,817 | 1/1987 | Cooper et al. | 361/62 |
| 4,642,733 | 2/1987 | Schacht | 361/118 |
| 4,644,439 | 2/1987 | Taarning | 361/87 |
| 4,652,867 | 3/1987 | Masot | 340/638 |
| 4,658,322 | 4/1987 | Rivera | 361/37 |
| 4,697,218 | 9/1987 | Nicolas | 633/882 |
| 4,702,002 | 10/1987 | Morris et al. | 29/837 |
| 4,707,759 | 11/1987 | Bodkin | 831/642 |
| 4,771,355 | 9/1988 | Emery et al. | 361/33 |
| 4,810,954 | 3/1989 | Fam | 324/142 |
| 4,833,564 | 5/1989 | Pardue et al. | 361/93 |
| 4,835,648 | 5/1989 | Yamauchi | 361/14 |
| 4,845,580 | 7/1989 | Kitchens | 361/91 |
| 4,853,818 | 8/1989 | Emery et al. | 361/33 |
| 4,858,054 | 8/1989 | Franklin | 361/57 |
| 4,866,560 | 9/1989 | Allina | 361/104 |
| 4,882,682 | 11/1989 | Takasuka et al. | 364/507 |
| 4,893,102 | 1/1990 | Bauer | 335/132 |
| 4,901,183 | 2/1990 | Lee | 361/56 |
| 4,922,368 | 5/1990 | Johns | 361/62 |
| 4,931,894 | 6/1990 | Legatti | 361/45 |
| 4,939,495 | 7/1990 | Peterson et al. | 337/79 |
| 4,949,214 | 8/1990 | Spencer | 361/95 |
| 4,969,063 | 11/1990 | Scott et al. | 361/93 |
| 5,010,438 | 4/1991 | Brady | 361/56 |
| 5,047,724 | 9/1991 | Boksiner et al. | 324/520 |
| 5,051,731 | 9/1991 | Guim et al. | 340/638 |
| 5,121,282 | 6/1992 | White | 361/42 |
| 5,166,861 | 11/1992 | Krom | 361/379 |
| 5,168,261 | 12/1992 | Weeks | 340/515 |
| 5,179,491 | 1/1993 | Runyan | 361/45 |
| 5,185,684 | 2/1993 | Beihoff et al. | 361/45 |
| 5,185,685 | 2/1993 | Tennies et al. | 361/45 |
| 5,185,686 | 2/1993 | Hansen et al. | 361/45 |
| 5,185,687 | 2/1993 | Beihoff et al. | 361/45 |
| 5,206,596 | 4/1993 | Beihoff et al. | 324/536 |
| 5,208,542 | 5/1993 | Tennies et al. | 324/544 |
| 5,223,795 | 6/1993 | Blades | 324/536 |
| 5,224,006 | 6/1993 | MacKenzie et al. | 361/45 |
| 5,257,157 | 10/1993 | Epstein | 361/111 |
| 5,280,404 | 1/1994 | Ragsdale | 361/113 |
| 5,286,933 | 2/1994 | Pham | 200/144 B |
| 5,307,230 | 4/1994 | MacKenzie | 361/96 |
| 5,334,939 | 8/1994 | Yarbrough | 324/424 |
| 5,353,014 | 10/1994 | Carroll et al. | 340/638 |
| 5,359,293 | 10/1994 | Boksiner et al. | 324/544 |
| 5,363,269 | 11/1994 | McDonald | 361/45 |
| 5,383,084 | 1/1995 | Gershen et al. | 361/113 |
| 5,388,021 | 2/1995 | Stahl | 361/56 |
| 5,396,179 | 3/1995 | Domenichini et al. | 324/546 |
| 5,412,526 | 5/1995 | Kapp et al. | 361/56 |
| 5,414,590 | 5/1995 | Tajali | 361/669 |
| 5,420,740 | 5/1995 | MacKenzie et al. | 361/45 |
| 5,424,894 | 6/1995 | Briscall et al. | 361/45 |
| 5,434,509 | 7/1995 | Blades | 324/536 |
| 5,444,424 | 8/1995 | Wong et al. | 335/172 |
| 5,446,431 | 8/1995 | Leach et al. | 335/18 |
| 5,448,443 | 9/1995 | Muelleman | 361/111 |
| 5,452,223 | 9/1995 | Zuercher et al. | 364/483 |
| 5,459,630 | 10/1995 | MacKenzie et al. | 361/45 |
| 5,477,150 | 12/1995 | Ham, Jr. et al. | 324/536 |
| 5,481,235 | 1/1996 | Heise et al. | 335/18 |
| 5,483,211 | 1/1996 | Carrodus et al. | 335/18 |
| 5,485,093 | 1/1996 | Russell et al. | 324/522 |
| 5,493,278 | 2/1996 | MacKenzie et al. | 340/638 |
| 5,506,789 | 4/1996 | Russell et al. | 364/492 |
| 5,510,946 | 4/1996 | Franklin | 361/56 |
| 5,512,832 | 4/1996 | Russell et al. | 324/522 |
| 5,519,561 | 5/1996 | Mrenna et al. | 361/105 |
| 5,531,617 | 7/1996 | Marks | 439/723 |
| 5,546,266 | 8/1996 | Mackenzie et al. | 361/93 |
| 5,561,605 | 10/1996 | Zuercher et al. | 364/483 |
| 5,568,371 | 10/1996 | Pitel et al. | 363/39 |
| 5,578,931 | 11/1996 | Russell et al. | 324/536 |
| 5,590,012 | 12/1996 | Dollar | 361/113 |
| 5,602,709 | 2/1997 | Al-Dabbagh | 361/85 |
| 5,608,328 | 3/1997 | Sanderson | 324/529 |
| 5,627,244 | 5/1997 | Seitz | 364/492 |
| 5,659,453 | 8/1997 | Russell et al. | 361/93 |
| 5,682,101 | 10/1997 | Brooks et al. | 324/536 |
| 5,691,869 | 11/1997 | Engel et al. | 361/42 |
| 5,701,110 | 12/1997 | Soheel et al. | 335/132 |
| 5,706,154 | 1/1998 | Seymour | 361/42 |
| 5,729,145 | 3/1998 | Blades | 324/536 |
| 5,805,397 | 9/1998 | MacKenzie | 361/42 |
| 5,805,398 | 9/1998 | Rae | 361/42 |
| 5,815,352 | 9/1998 | Mackenzie | 361/42 |
| 5,818,237 | 10/1998 | Zuercher et al. | 324/536 |
| 5,818,671 | 10/1998 | Seymour et al. | 361/42 |
| 5,835,319 | 11/1998 | Welles, II et al. | 361/5 |
| 5,835,321 | 11/1998 | Elms et al. | 361/45 |

Fig. 3
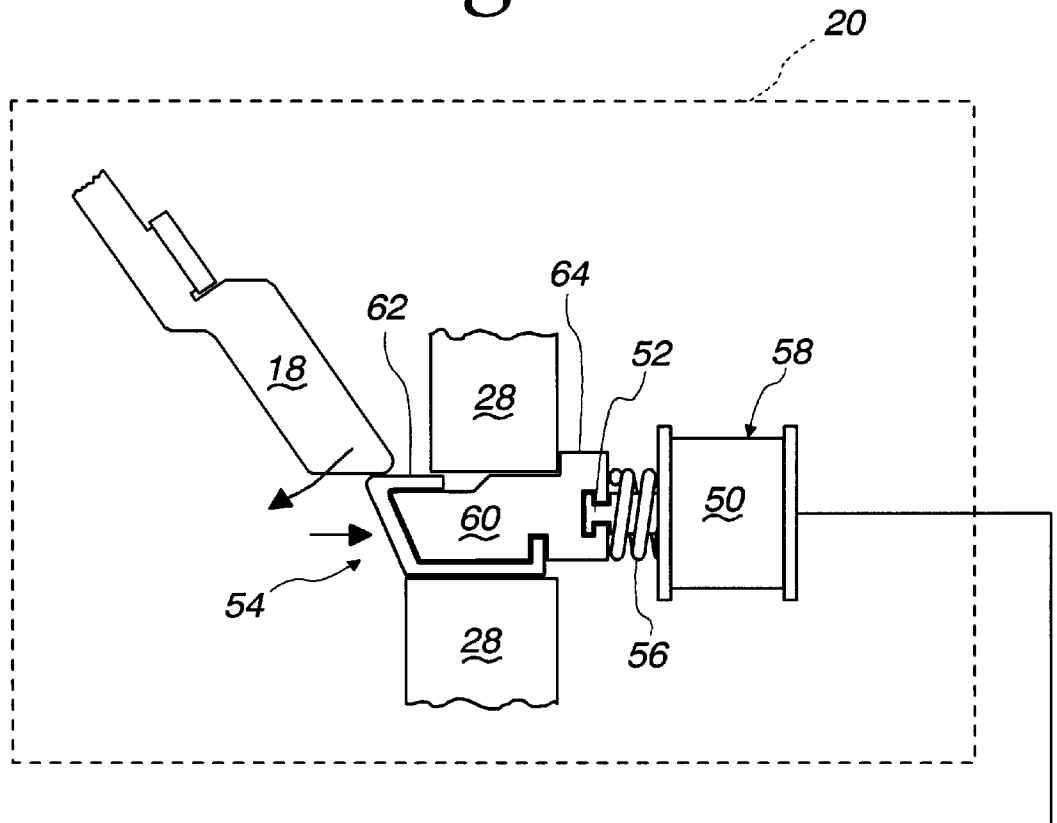
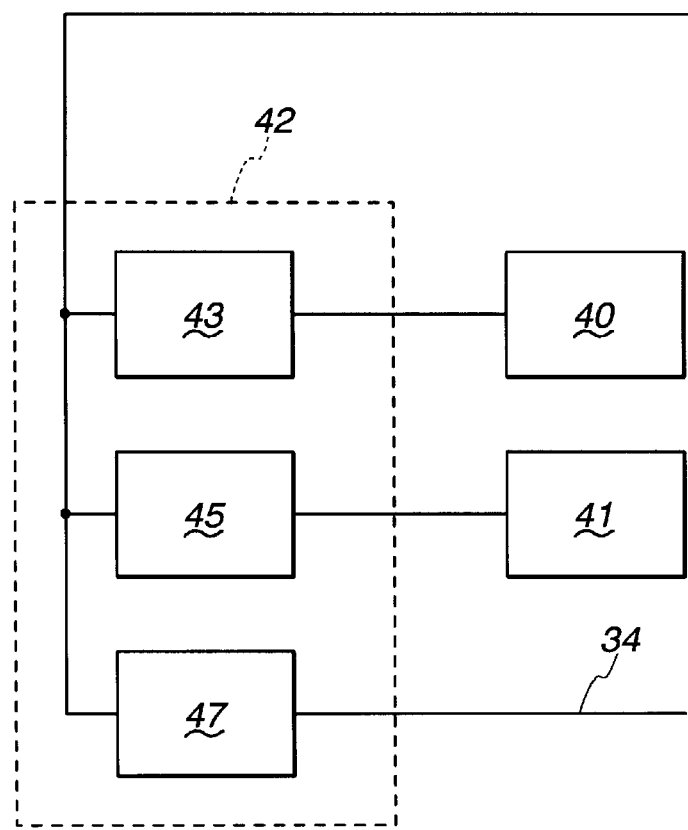

ELECTRONICALLY CONTROLLED CIRCUIT BREAKER WITH INTEGRATED LATCH TRIPPING

FIELD OF THE INVENTION

The present invention relates to the protection of electric circuits and, more particularly, to a circuit breaker with an electronic trip system and an integrated latch mechanism.

BACKGROUND OF THE INVENTION

The electrical systems in residential, commercial and industrial applications usually include a panelboard for receiving electrical power from a utility source. The power is then routed through protection devices to designated branch circuits supplying one or more loads. These protection devices are typically circuit interrupters such as circuit breakers and fuses which are designed to interrupt the electrical current if the limits of the conductors supplying the loads are surpassed. Interruption of the circuit reduces the risk of injury or the potential of property damage from a resulting fire.

Circuit breakers are a preferred type of circuit interrupters because a resetting mechanism allows their reuse. Typical circuit breakers are disclosed in U.S. Pat. Nos. 2,902,560, 3,098,136, 4,616,199 and 4,616,200, assigned to the instant assignee and incorporated herein by reference. These circuit breakers are designed to trip open and interrupt an electric circuit in response to detecting short circuits and overloads. Short circuit protection is provided by an electromagnetic element that trips when sensing high current flow. The elevated current level causes a high magnetic flux field around a yoke to draw a magnetic armature toward the yoke. The magnetically-drawn armature rotates about a pivot and a trip lever is released from its engagement with the armature. The release and movement of the trip lever causes moveable contacts to separate, thereby opening the circuit breaker and interrupting the electrical circuit.

Overload protection is provided by a thermal bimetal element which will bend when heated by the increased current, causing the circuit breaker to trip and interrupt the power. This can occur when too many loads draw power from the same branch circuit at the same time, or when a single load draws more power than the branch circuit is designed to carry. The bimetal is composed of two dissimilar thermostat materials which are laminated or bonded together and which expand at different rates due to temperature increase, thereby causing the bimetal to bend. The yoke and armature described in relation to magnetic tripping are connected to the bimetal, so the yoke and armature are carried with the bimetal as it bends. As described above in connection with magnetic tripping, this causes the armature to release its engagement of the trip lever, thereby causing the movable contacts to open and interrupt the electrical circuit.

Other types of circuit breakers will interrupt an electrical circuit in response to detecting ground faults or arcing faults. A ground fault trip condition is created by an imbalance of currents flowing between a line conductor and a neutral conductor such as a grounded conductor, a person causing a current path to ground, or an arcing fault to ground. When a ground fault occurs and some current is leaked to ground, a circuit breaker with ground fault detection circuitry detects the difference in current in the line and neutral power conductors. If the fault level exceeds the trip level of the ground fault circuitry, the ground fault circuitry opens the moveable contacts and interrupts the electrical circuit.

Arcing faults are commonly defined as current through ionized gas between two ends of a broken conductor, between two conductors supplying a load, or between a conductor and ground. An arcing fault may be caused by corroded, worn or damaged wiring or insulation, and electrical stress caused by repeated overloading, lightning strikes, etc. When an arcing fault occurs, a circuit breaker with arcing fault detection circuitry detects the rate of change of current in a line conductor. If the rate of change exceeds a predetermined threshold, the circuitry opens the moveable contacts and interrupts the electrical circuit.

There are several problems associated with prior art tripping mechanisms. First, the bimetal associated with a thermal trip must be individually calibrated to achieve precise tripping characteristics in each individual circuit breaker. This calibration procedure is time consuming and expensive. Accordingly, there is a need to provide a circuit breaker without a bimetal in order to eliminate the calibration requirement. Second, the bimetal, yoke and armature tripping mechanism associated with conventional circuit breakers create inflexibility in features and components. Accordingly, there is a need to improve the conventional tripping mechanisms.

The present invention is directed to overcoming or at least reducing the effects of one or more of the problems set forth above.

SUMMARY OF THE INVENTION

In accordance with one aspect of the present invention, there is provided a circuit breaker for interrupting the electrical current flowing through a line conductor to a load terminal in response to the detection of an arcing fault, ground fault and/or overload. The circuit breaker has a sensor for sensing the electrical current in an electrical power distribution circuit and for sending a signal representing the characteristics of the current to an electronic detector. When the detector detects the occurence of an overload, ground fault or arcing fault, a trip signal is sent to an actuator. In response to the trip signal, the actuator actuates a trip mechanism for opening and closing a pair of breaker contacts which open and close the electrical circuit.

The trip mechanism of the circuit breaker has a releasably latchable trip lever, and a latching mechanism. The trip lever is moveable between a latched position and a tripped position. In the latched position, the trip lever engages the latching mechanism and the electrical current flows through said circuit breaker. When an arcing fault, ground fault and/or overload is detected, a trip signal is send to the actuator to move the latching mechanism from an engaged position to a released position. Upon receiving the trip signal, the latching mechanism disengages the trip lever allowing the trip lever to slide into the tripped position to interrupt the current flow through the circuit breaker.

The latching mechanism may consist of a coil, plunger and latch plate. The latch plate engages the trip lever in the latched position. The coil receives the trip signal and creates a magnetic field. The plunger interlocking with the latch plate is drawn into the coil by the magnetic field. When the plunger moves into the coil, the latch plate disengages the trip lever and causes the trip lever to move into the tripped position.

The latching mechanism may also consist of an armature, yoke and trip coil. The armature engages the trip lever in the latched position. The trip coil receives the trip signal and creates a magnetic field around the yoke. The armature is drawn toward the yoke by the magnetic field. When the armature moves toward the yoke, the armature disengages the trip lever and causes the trip lever to move into the tripped position.

BRIEF DESCRIPTION OF THE DRAWINGS

The foregoing and other advantages of the invention will become apparent upon reading the following detailed description and upon reference to the drawings in which:

FIG. 3 is a side elevation of a latching mechanism, comprising a latch plate, spring, coil and plunger which may be used in the circuit breaker of FIG. 1 according to one embodiment of the present invention and illustrates the associated sensing and detection circuits in block diagram;

Figure 1:
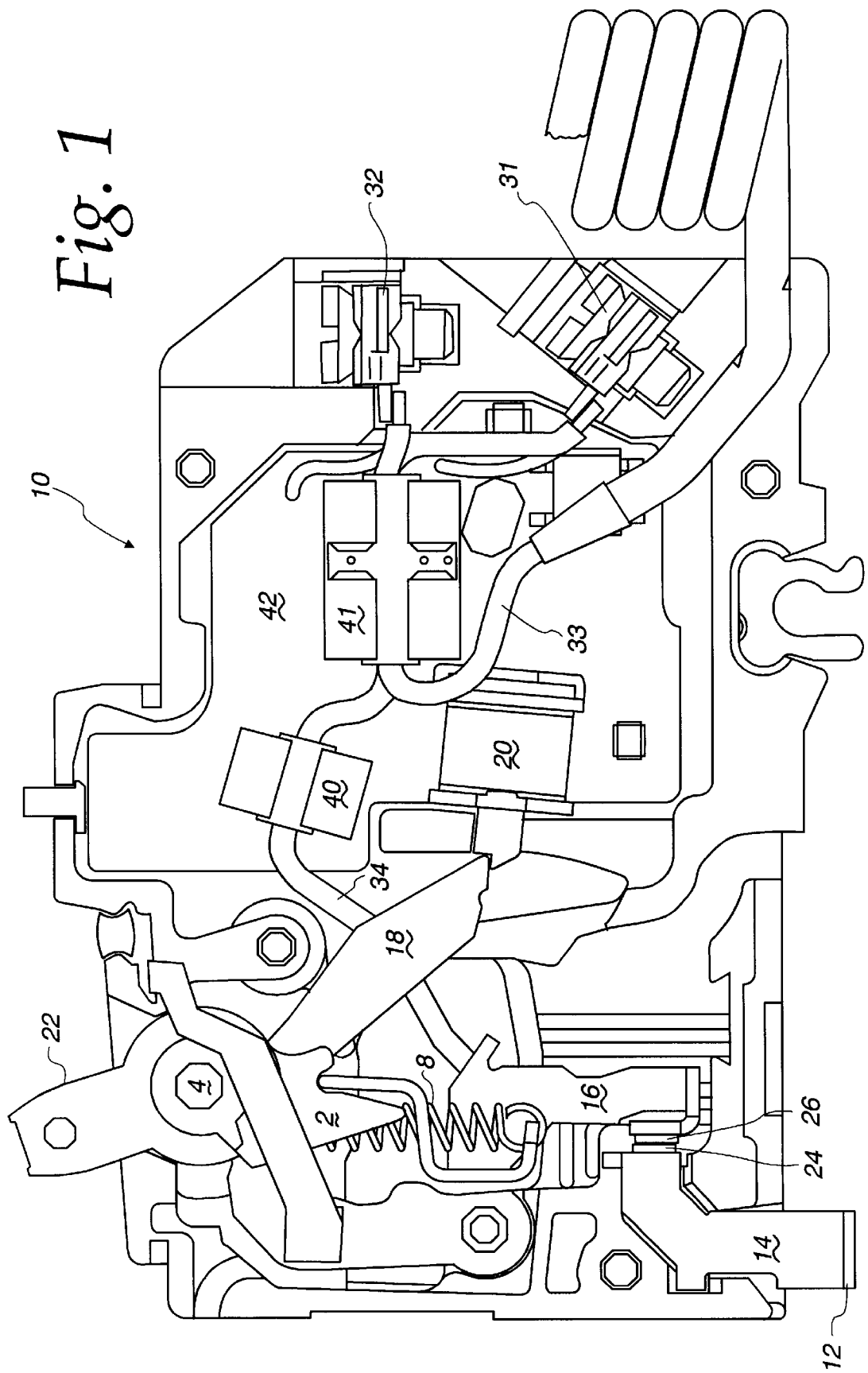
FIG. 1 is a plan view of an electronically controlled circuit breaker with integrated latch tripping according to one embodiment of the present invention.

While the invention is susceptible to various modifications and alternative forms, specific embodiments have been shown by way of example in the drawings and will be described in detail herein. However, it should be understood that it is not intended to be limited to the particular forms disclosed. Rather, the invention is to cover all modifications, equivalents, and alternatives falling within the spirit and scope of the invention as defined by the appended claims.

DETAILED DESCRIPTION

Turning now to the drawings and referring initially to FIG. 1, there is illustrated an electronically controlled circuit breaker 10 with integrated latch tripping. The circuit breaker 10 is adapted to be plugged into a panelboard and power is routed through the circuit breaker 10 via a line terminal 12 and a load terminal 32. As depicted in FIG. 1, the circuit breaker 10 is in a closed position, enabling current to flow through the circuit breaker. The current path through the circuit breaker 10 extends from a line terminal 12 formed by the stationary contact carrier 14 to a load terminal 32. In the closed position, current flows from the line terminal 12 to the moveable contact carrier 16 via the stationary and moveable contacts 24 and 26 respectfully. From the moveable contact carrier 16, a flexible line conductor 34 connects the current path to the load terminal 32. Current flows out of the load end of the circuit breaker via a terminal block of the load terminal 32.

The circuit breaker 10 includes an actuating mechanism 2 which opens and closes the contacts 24 and 26. For the open position, the moveable contact carrier 16 is rotated away from the stationary contact carrier 14, causing the moveable contact 26 to separate from the stationary contact 24. When the contacts 24 and 26 separate, current no longer flows from the line terminal 12 to the load terminal 32. The circuit breaker 10 may be tripped open in any of several ways, including manual control and in response to an overload, arcing fault and ground fault conditions.

The circuit breaker 10 may be moved between the open and closed positions by a user manually moving the handle 22 to the right or left, respectfully, causing corresponding movement of the upper end of the moveable contact carrier 16 to the left or right of a pivot point. A spring 8 is connected at one end to the handle 22 and at another end to the bottom of the moveable contact carrier 16. When the upper end of the moveable contact carrier 16 is left of the pivot point, the spring biases the bottom of the moveable contact carrier 16 to the open position. Conversely, when the upper end of the moveable contact carrier 16 is right of the pivot point, the spring 8 biases the bottom of the moveable contact carrier to the closed position.

The circuit breaker 10 may also be tripped in response to sensing arcing faults, ground faults and overloads. FIG. 3 illustrates the relationship between the components for tripping the circuit breaker 10 in response to sensing arcing faults, ground faults and overloads. To detect the occurrence of an arcing fault when the contacts 24 and 26 are in a closed position, an arcing fault sensor 40 monitors a rate-of-change of electrical current in the line conductor 34 and provides a signal representing the rate-of-change to a trip circuit 42 comprising electronic circuitry mounted on circuit board 42. The arcing fault detection circuitry 43 in the trip circuit 42 analyzes the signal for characteristics of an arcing fault. When the arcing fault detection circuitry 43 detects the presence of an arcing fault, it sends a trip signal to the latching mechanism 20 to trip the circuit breaker 10.

In the closed position, a releasable latching trip lever 18 engages the latching mechanism 20. The trip lever 18 is pivotally mounted about a pivot at one end. The other end of the trip lever 18 is seated in a latched position on the latching mechanism 20. The spring 8 connects the trip lever 18 to the moveable contact carrier 16. When the latching mechanism 20 receives the trip signal, the latching mechanism 20 releases the trip lever 18 from its latched position. The trip lever 18 swings clockwise to its tripped position carrying the upper end of the spring 28 to the opposite side of its dead center position. The spring 8 rotates the movable contact carrier 16 from the closed circuit position to the open circuit position separating the moveable contact 26 from the stationary contact 24.

To detect the occurrence of a ground fault when the contacts 24 and 26 are in a closed position, a ground fault sensor 41 detects the difference in current in the line conductor 34 and a neutral conductor 33 and provides a signal representing the difference to the trip circuit 42. Ground fault detection circuitry 45 in the trip circuit 42 analyzes the signal for characteristics of a ground fault. If the ground fault detection circuitry 45 detects a ground fault, the trip circuit 42 sends a trip signal to the latching mechanism 20 to trip the circuit breaker 10 in the same fashion as described above.

To detect the occurrence of an overload when the contacts 24 and 26 are in a closed position, the overload circuitry 47 of the trip circuit 42 samples the current flowing through the line conductor 34. The overload circuitry 47 analyzes current samples for characteristics of an overload. If the trip circuit 42 detects an overload, the trip circuit sends a trip signal to the latching mechanism 20 to trip the circuit breaker 10 in the same fashion as described above.

The flexibility of electronic components of the trip circuit provide the circuit breaker with a variety of detection features. The circuit breaker 10 may be provided with circuitry to open the breaker 10 in response to an arcing fault, ground fault or overload. The electronic components of the trip circuit may be modified to detect only one of the above conditions, or all of the listed conditions. In every possible case, the trip circuit will provide the latching mechanism 20 with a trip signal in response to the occurrence of a detected condition.

The circuit breaker 10 of FIG. 1 includes an arcing fault sensor 40 for detecting arcing faults. The arcing fault sensor 40 monitors the rate-of-change of electrical current in the line conductor 34 and produces a signal representing the rate-of-change. The pattern of the fluctuations in the rate-of-change signal produced by the arcing fault sensor 40 indicates whether the circuit is in a normal operating condition or an arcing fault condition. Examples of a suitable arcing fault sensor 40 for producing the desired rate-of-change signal are a toroidal transformer with a core of magnetic material or an air core, an inductor or a transformer with a laminated core of magnetic material, and inductors mounted on printed circuit boards.

Other means for sensing the rate-of-change of the current in the line conductor 34 are contemplated by the present invention. By Faraday's Law, any coil produces a voltage proportional to the rate of change in magnetic flux passing through the coil. The current associated with a fault generates a magnetic flux around the conductor, and the coil of the sensor intersects this flux to produce a signal. Other suitable sensors include a toroidal sensor having an annular core encompassing the current carrying line 34, with the sensing coil wound helically on the core. The core is made of magnetic material such as a ferrite, iron, or molded permeable powder capable of responding to rapid changes in flux. A preferred arcing sensor 40 uses a ferrite core wound with 200 turns of 24–36 gauge copper wire to form the sensing coil. An air gap may be built into the core to reduce the permeability to about 30. The core material preferably does not saturate during the relatively high currents produced by parallel arcs, so that fault detection is still possible those high current levels. Various configurations for the sensor core are contemplated by the present invention and include toroids which have air gaps in their body.

Preferably, the rate-of-change signal produced by the arcing fault sensor 40 represents only fluctuations in the rate of change within a selected frequency band. The sensor's bandpass characteristic is preferably such that the lower frequency cut-off point rejects the power frequency signals, while the upper frequency cut-off point rejects the high frequency signals generated in the presence of noisy loads such as a solder gun, electric saw, electric drill, or like appliances, equipment, or tools. The resulting output of the arcing fault sensor 40 is thus limited to the selected frequency band associated with faults, thereby eliminating or reducing spurious fluctuations in the rate-of-change signal which could result in nuisance tripping. As an example, the sensor bandpass characteristic may have: (1) a lower frequency cut-off point or lower limit of 60 Hz so as to reject power frequency signals, and (ii) an upper frequency cut-off point or upper limit of approximately 1 MHz so as to effectively reject all high frequency signals associated with noisy loads. The specific frequency cut-off points for the sensor bandpass characteristic have been described above by way of illustration only, and appropriate alternate frequency cut-off limits may be adopted depending upon actual frequency ranges for the power signals as well as the noisy load signals.

The desired bandpass characteristic is realized by appropriately selecting and adjusting the self-resonant frequency of the sensor. The current-type sensor is selected to have a predetermined self-resonant frequency which defines associated upper and lower frequency cut-off or roll-off points for the operational characteristics of the sensor. Preferably, the current-type sensor is designed to exhibit the desired bandpass filtering characteristic as it operates to detect the rate of change of current variations only within the selected frequency band. The present invention contemplates other means for bandpass filtering the signal output within the selected frequency band. For example, a bandpass filter or a combination of filters in a circuit can be used to attenuate frequencies above or below the cut-off points for the selected frequency band.

Figure 2:
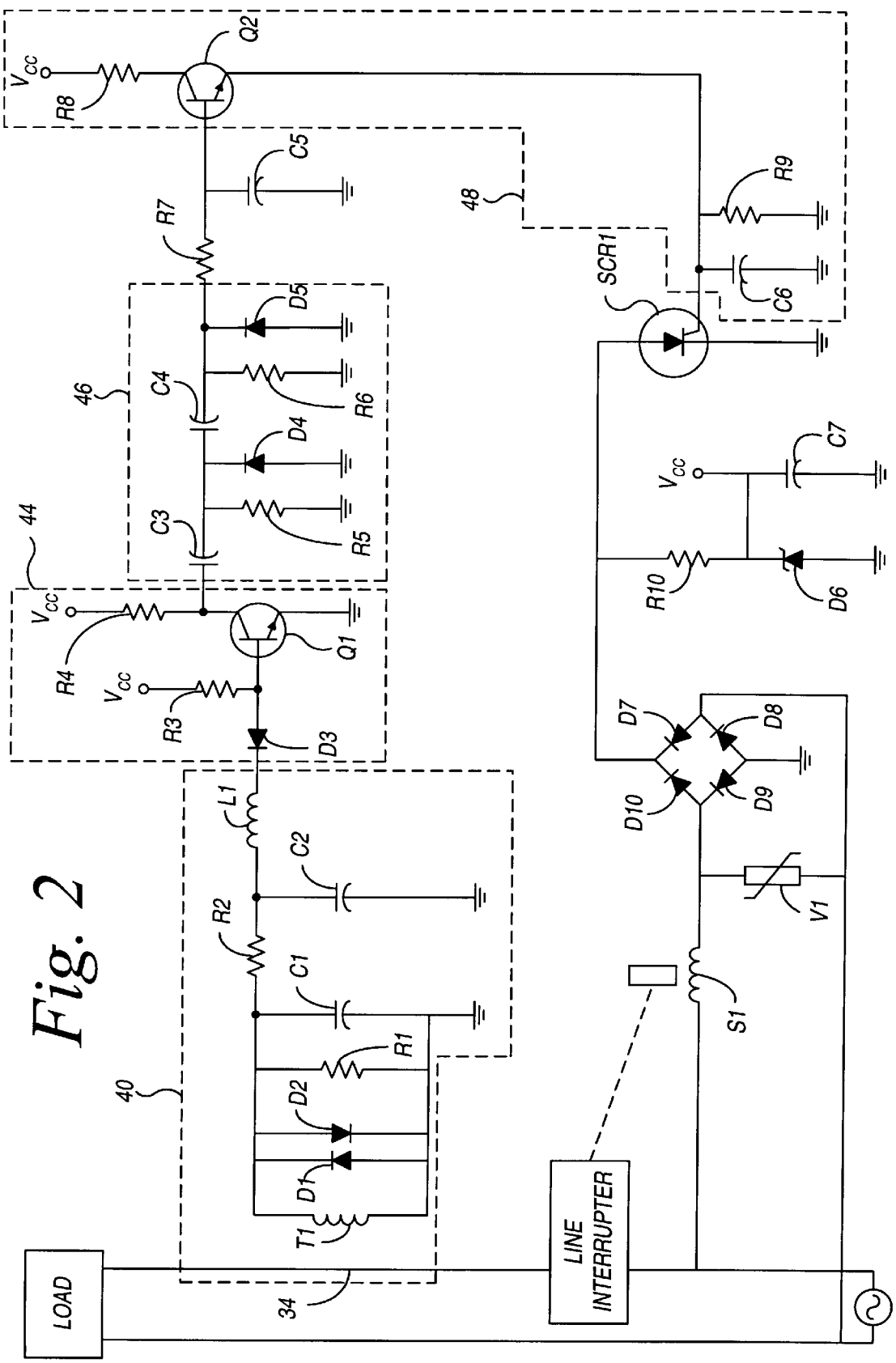
FIG. 2 is a schematic diagram of a trip circuit used to generate a trip signal in the circuit breaker of FIG. 1.

The trip circuit includes arcing fault detection circuitry for analyzing the arcing fault sensor output to determine the presence of an arcing fault. FIG. 2 illustrates one embodiment for the arcing fault detection circuitry. The arcing fault sensor 40 produces the desired rate-of-change signal (commonly referred to as a "di/dt signal") in the form of an output voltage which is connected to a comparator circuit 44 through a filtering network in the sensor and a diode D3. The rate-of-change signal originates in the sensor coil T1 which is wound on a core surrounding the line conductor 34. Connected in parallel with sensor coil T1 are a pair of diodes D1 and D2 which serve as clamping devices during high-power transient conditions. A resistor R1 in parallel with the diodes D1 and D2 dampens self-ringing of the sensor, during high-power transients. A pair of capacitors C1 and C2 in parallel with the resistor R1, and resistor R2 and an inductor L1 connected in series to the input to the comparator 44, are tuned to assist in attaining the desired rolloff characteristics of the filtering network formed thereby. For example, with the illustrative values listed below for the components of the circuit of FIG. 2, the sensor has a passband extending from about 10 KHz to about 100 KHz, with sharp rolloff at both sides of the passband.

In the comparator 44, the magnitude of the rate-of-change signal from the sensor 40 is compared with the magnitude of a fixed reference signal, and the comparator 44 produces an output voltage only when the magnitude of the rate-of-change signal crosses that of the reference signal. This causes the trip circuit to ignore low-level signals generated by the sensor 40. All signals above the threshold level set by the magnitude of the reference signal are amplified to a preset maximum value to reduce the effect of a large signal. In the comparator 44, a transistor Q1 is normally turned on with its base pulled high by a resistor R3. A diode D3 changes the threshold and allows only the negative pulses from the sensor 40 to be delivered to the base of transistor Q1. When the signal to the comparator drops below the threshold level (minus 0.2 volt for the circuit values listed below), this causes the transistor Q1 to turn off. This causes the collector of the transistor Q1 to rise against a reference voltage, determined by the supply voltage $V_{cc}$, a resistor R4 and the input impedance of a single-shot pulse generator circuit 46. This collector voltage is the output of the comparator 44. The collector voltage remains high as long as the transistor Q1 is turned off, which continues until the signal from the sensor 40 rises above the threshold level again. The transistor Q1 then turns on again, causing the collector voltage to drop. The end result is a pulse output from the comparator 44, with the width of the pulse corresponding to the time interval during which the transistor Q1 is turned off, which in turn corresponds to the time interval during which the signal from the sensor 40 remains below the threshold level of the comparator 44.

The output of the transistor Q1 is a series of positive-going pulses corresponding to the negative-going peaks in the input signal. The transistor circuit functions as a comparator by producing output pulses corresponding only to negative-going peaks that exceed a certain threshold in the filtered di/dt signal. At this point in the circuit, the pulses vary in both width and amplitude.

To convert the output pulses of the comparator 44, which vary in both width and amplitude, into a series of pulses of substantially constant width and amplitude, the comparator 44 output is fed to a single-shot pulse generator circuit 46. This high-pass filter circuit includes a pair of capacitors C3 and C4 connected in series to the collector of the transistor Q1, and two resistor-diode pairs connected in parallel from opposite sides of the capacitor C4 to ground. The output pulses are predominantly pulses of equal width and amplitude, although occasional larger or smaller pulses can result from especially large or small input pulses.

The variable-width and variable-amplitude pulses are converted to a series of pulses of substantially constant width and amplitude by the single-shot pulse generator circuit 46. Large or small pulses may be produced by di/dt spikes that are excessively large or excessively small. The vast majority of the pulses, however, are substantially independent of the amplitude and duration of the corresponding spikes in the di/dt signal, provided the spikes are large enough to produce an output pulse from the comparator 44.

The substantially uniform pulses produced by the circuit 46 are supplied to the base of a transistor Q2 through a current-limiting resistor R7. A capacitor C5 connected from the transistor base to ground improves the sharpness of the roll-off of the bandpass filtering. The transistor Q2 is the beginning of an integrator circuit 48 that integrates the pulses produced by the circuit 46. The pulses turn the transistor on and off to charge and discharge a capacitor C6 connected between the transistor emitter and ground. A resistor R9 is connected in parallel with the capacitor C6, and a resistor R8 connected between the supply voltage and the collector of the transistor Q2 determines the level of the charging current for the capacitor C6. The magnitude of the charge on the capacitor at any given instant represents the integral of the pulses received over a selected time interval. Because the pulses are substantially uniform in width and amplitude, the magnitude of the integral at any given instant is primarily a function of the number of pulses received within the selected time interval immediately preceding that instant. Consequently, the value of the integral can be used to determine whether an arcing fault has occurred.

The integrator circuit 48 charges each time it receives a pulse from the circuit 46, and then immediately begins to discharge. The charge accumulates only when the pulses appear at a rate sufficiently high that the charge produced by one pulse is less than the discharge that occurs before the next pulse arrives. If the pulses arrive in sufficient number and at a sufficient rate to increase the integral signal to a trip threshold level TR, SCR1 is triggered to send the trip signal to the latching mechanism 20. The circuit is designed so that this occurs only in response to a di/dt signal representing an arcing fault.

When SCR1 is turned on, the trip signal is sent to the latching mechanism S1. Specifically, turning on SCR1 causes current to flow from line to neutral through a diode bridge formed by diodes D7–D10, thereby energizing the latching mechanism to interrupt the circuit. The d-c. terminals of the diode bridge are connected across SCR1, and the voltage level is set by a zener diode D6 in series with a current-limiting resistor R10. A varistor V1 is connected across the diode bridge as a transient suppressor. A filtering capacitor C7 is connected across the zener diode D6. The trip circuit loses power when the circuit breaker contacts are opened, and the contacts remain open until reset.

One example of a circuit that produces the desired result described above is the circuit of FIG. 2 having the following values:

| | |
|---|---|
| D1 | 1N4148 |
| D2 | 1N4148 |
| D3 | 1N4148 |
| D4 | 1N4148 |
| D5 | 1N4148 |
| D6 | 27 v zener |
| R1 | 3.01K |
| R2 | 1.3K |
| R3 | 174K |
| R4 | 27.4K |
| R5 | 10K |
| R6 | 10K |
| R7 | 10K |
| R8 | 4.2K |
| R9 | 4.75K |
| R10 | 24K |
| L1 | 3300 uH |
| C1 | 0.012 uF |
| C2 | 0.001 uF |
| C3 | 0.001 uF |
| C4 | 0.001 uF |
| C5 | 0.001 uF |
| C6 | 6.8 uF |
| C7 | 1.0 uF |
| Q1 | 2N2222A |
| Q2 | 2N2222A |
| SCR1 | CR08AS-12 made by POWEREX-Equal |
| Vcc | 27 v |

A number of modifications may be made to the arcing fault detection circuitry of FIG. 2. Other embodiments for a trip circuit that detects arcing faults are described in copending U.S. patent application Ser. No. 08/600,512, which is commonly assigned and incorporated herein by reference.

The circuit breaker of FIG. 1 further includes a neutral conductor 33. In embodiments with ground fault detection, the neutral conductor 33 is routed through a ground fault sensor 41 along with the line conductor 34 to permit sensing of an imbalance of current flow between the line and neutral conductors 34 and 33 as is known in the art. FIG. 3 illustrates the relationship between the components for tripping the circuit breaker 10 in response to sensing ground faults. The ground fault sensor 41 sends a signal representing the current imbalance to the trip circuit 42. Ground fault detection circuitry 45 in the trip circuit 42 analyzes the signal. A more complete description of the ground fault sensing and detection circuitry 45 is disclosed in U.S. Pat. Nos. 5,136,457, and 5,446,431, assigned to the instant assignee and incorporated herein by reference. When a ground fault occurs and some current is leaked to ground, the ground fault detection circuitry 45 detects the difference in current in the power conductors. If the fault level exceeds the trip level of the ground fault circuitry 45, the trip circuit 42 sends the trip signal to the latching mechanism 20.

The circuit breaker 10 may further include a trip circuit with overload detection circuitry. The overload detection circuitry simulates the bimetal deflection of traditional circuit breakers. A more complete description of the overload detection circuitry is disclosed in U.S. Pat. No. 5,136,457, assigned to the instant assignee and incorporated herein by reference. FIG. 3 illustrates the relationship between the components for tripping the circuit breaker 10 in response to sensing overloads. To simulate the bi-metal deflection the trip circuit 42 with the overload circuitry 47 in the trip circuit 42 accumulates the squared values of current samples taken from the line conductor 34. The sum of the squared values of that current is proportional to the accumulated heat in the tripping system. The overcurrent circuitry 47 decrements logarithmically the accumulated square of the current to account for the rate of heat lost due to the temperature of the power system conductors being above ambient temperature. When the accumulating value exceeds a predetermined threshold representing the maximum allowed heat content of the system, the trip circuit 42 sends the trip signal to the latching mechanism 20.

When the latching mechanism 20 receives the trip signal from the trip circuit 42, the latching mechanism 20 moves from an engaged position to the right to a released position. In the engaged position the latch mechanism 20 engages the trip lever 18. As the latching mechanism 20 moves to its released position the trip lever 18 releases from its latched position and swings to its tripped position separating the contacts 26 and 24 as described above.

FIG. 3 is an enlarged side elevation of one embodiment of the latching mechanism 20. The latching mechanism 20 contains a coil 50, plunger 52, latch plate 54 and bias spring 56. The coil 50 is a typical solenoid, and the plunger 52 is positioned for movement into the coil 50. The latch plate 54 of FIG. 3 has a plastic rectangular block portion 60 partially surrounded by a thin metal jacket 62. The plastic portion 60 has an orifice end interlocking with a steel cylindrical plunger 52 to form the plunger/latch plate assembly. When the latching mechanism 20 is in the engaged position, the seat end of the latch plate 54 engages the trip lever 18. The metal jacket 62 of the latch plate 54 supplies a smooth, non-corrosive surface for easy motion within the breaker case 28 and away from the trip lever 18. The smooth motion from the engaged position to the released position gives the breaker 10 consistent tripping action.

The latching mechanism of FIG. 3 further includes a bias spring 56 surrounding the plunger 52. One end of the bias spring 56 abuts the latch plate 54 and the other end abuts the coil 50. The bias spring 56 may abut the exterior portion of the coil housing 58, or the bias spring may be positioned within the coil 50 (see FIG. 4). The bias spring 56 pushes the plunger/latch plate assembly 52 and 54 away from the coil 50 to bias them toward the engaged position for seating the trip lever 18 on the latch plate 54.

When a overload, ground fault or arcing fault is detected by the trip circuit, the trip circuit sends a trip signal to the coil 50. The trip signal energizes the coil 50 and creates a magnetic field within the coil 50. The magnetic field draws the plunger 52 further into the coil 50. The plunger's motion into the coil 50 moves the plunger/latch plate assembly 52 and 54 to the right and compresses the bias spring 56. This motion pulls the latch plate 54 away from the trip lever 18 and disengages the trip lever 18 from its seat on the latch plate 54. The trip lever 18 slides off of the latch plate 54 into the tripped position, thereby causing the separation of the movable contact 26 from the stationary contact 24 and opening the circuit breaker 10.

FIG. 3 also illustrates an additional feature for the tripping mechanism 20. An upwardly extending stop 64 is formed on the latch plate 54. The stop 64 limits the movement of the plunger/latch plate assembly within the case 28. The stop 64 halts the motion of the plunger/latch plate assembly 52 and 54 to the left after the assembly has reached the position necessary to engage the trip lever 18. The stop 64 also halts the motion of the assembly 52 and 54 to the right after it has reached the position necessary to disengage the trip lever 18 from its seat on the latch plate 54.

Once the circuit breaker is in the released position, causing the trip lever 18 to be in the tripped position, current stops flowing from the line terminal 12 to the load terminal 32. Current no longer flows through the line conductor 34. The current sensors 40 and 41 stop providing signals to the trip circuit because no current is available to measure. The trip circuit ceases transmitting a trip signal to the tripping mechanism 20, so the coil 50 is no longer energized. The magnetic field in the coil 50 vanishes, and the bias spring 56 returns the plunger 52 and latch plate 54 to their engaged positions.

To reset the circuit breaker, a user manually moves the handle 22 (FIG. 1) to the typical reset position, moving the trip lever 18 upward to its latched position. The upper edge of the trip lever 18 moves the plunger/latch plate 52 and 54 toward the coil 50 by compressing the bias spring 56. When the trip lever 18 reaches its upper position, the plunger/latch plate 54 return to their engaged position, seating the trip lever 18 in its latched position.

Figure 4:
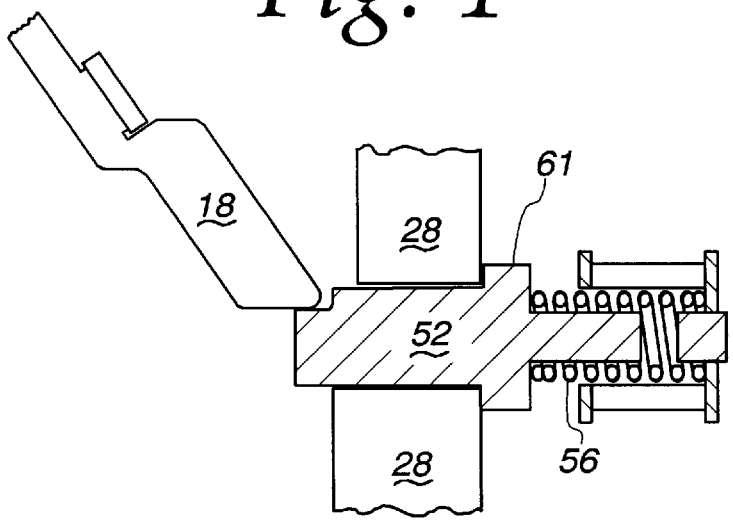
FIG. 4 is a plan view of a latching mechanism, comprising a coil, spring and plunger which may be used in the circuit breaker of FIG. 1 according to another embodiment of the present invention.

There are several alternative embodiments for the integrated latch mechanism formed by the plunger/latch plate assembly 52 and 54 and the trip lever 18. FIG. 4 shows another embodiment for the plunger/latch plate assembly 52 and 54. In this case, the plunger 52 performs the function of the latch plate in the engaged position by providing a seat to mechanically engage the trip lever 18. The plunger 52 is a steel cylinder with a flattened seat end for mechanically engagement with the trip lever 18. The smooth surfaces of the plunger 52 eliminate friction with the trip lever 18 and the breaker case 28 when the plunger moves from the engaged to released position. To implement this arrangement, the plunger 52 has slight shoulder stops 61 to captivate the bias spring 56.

Figure 5A:
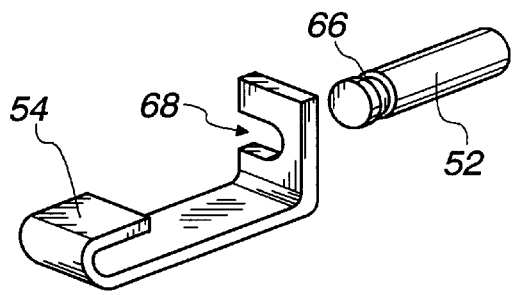
FIG. 5a is a perspective view of a plunger/latch plate assembly for a latching mechanism which may be used in the circuit breaker of FIG. 1 according to another embodiment of the present invention.
Figure 5B:
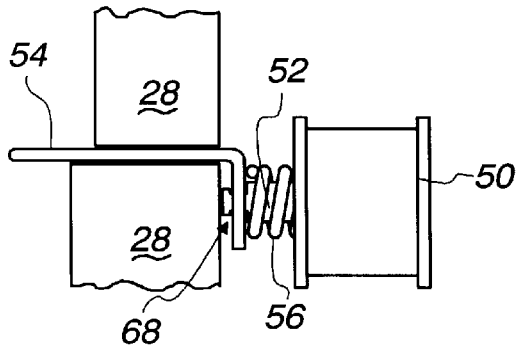
FIG. 5b is a plan view of the plunger/latch plate assembly of FIG. 5a in which the latch plate has a rounded end.
Figure 5C:
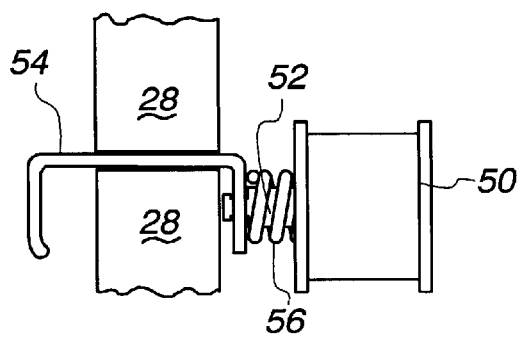
FIG. 5c is a plan view of the plunger/latch plate assembly of FIG. 5a in which the latch plate has a L-shaped end.

FIGS. 5*a*–5*c* illustrate further embodiments of the plunger/latch plate assembly 52 and 54. In FIG. 5*a*, a flat metal latch plate 54 has a notched end 68 interlocking with the groove end 66 of the plunger 52. As depicted in FIG. 5*b*, the notched end 68 of the latch plate 54 abuts the bias spring 56 and acts as a stop by limiting the movement of the plunger/latch plate assembly 52 and 54 in the breaker case 28. The latch plate 54 in FIG. 5*a* has a folded seat end to engage the trip lever 18. Alternative embodiments for the seat end of the latch plate 54 are a rounded end of FIG. 5*b* and a L-shaped end turned away from the trip lever 18 as illustrated by FIG. 5*c*. For consistent tripping action, the surfaces of the above latch plates 54 are buffed smooth and rounded to allow the latch plate 54 to slide smoothly in the case 28 and away from the trip lever 18.

Figure 6A:
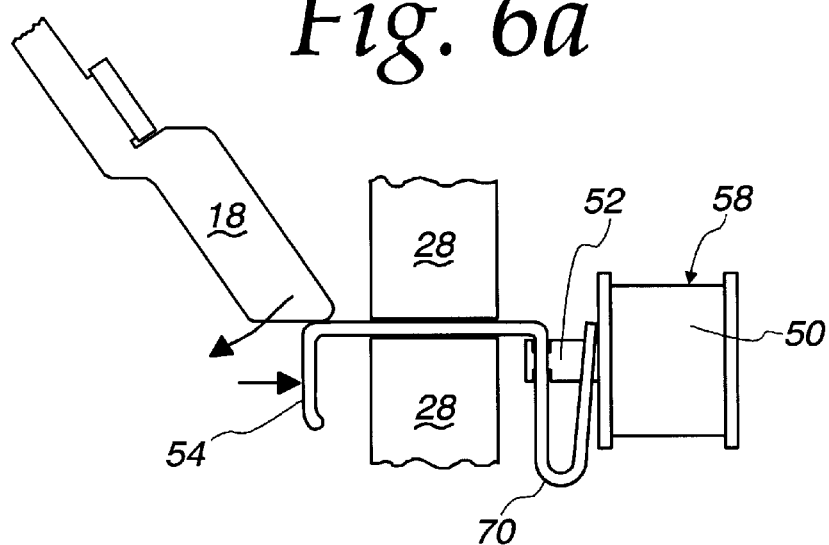
FIG. 6a is a plan view of a latching mechanism comprising a latch plate with an integrated spring, coil and plunger which may be used in the circuit breaker of FIG. 1 according to another embodiment of the present invention.
Figure 6B:
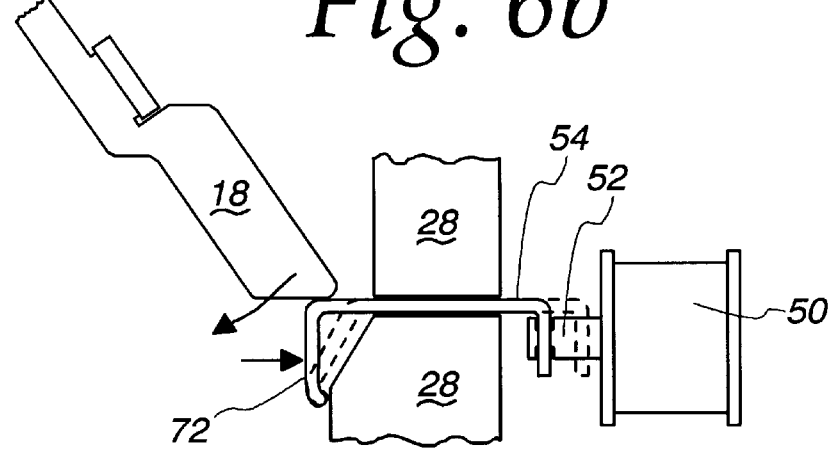
FIG. 6b is a plan view of a latching mechanism comprising a latch plate with an integrated spring, coil and plunger which may be used in the circuit breaker of FIG. 1 according to another embodiment of the present invention.
Figure 6C:
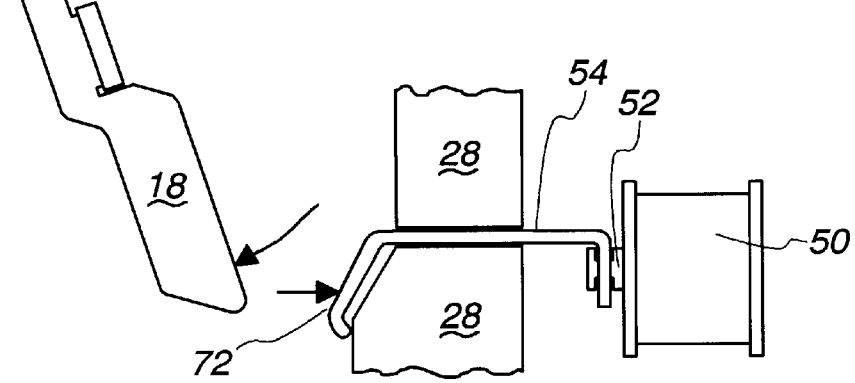
FIG. 6c is a plan view of the latching mechanism of FIG. 6b with the integrated spring flexed.

FIGS. 6a–6c depict a plunger/latch plate assembly 52 and 54 with a latch plate 54 functioning as a self contained bias spring. In this arrangement, the latch plate 54 itself performs the biasing function of the bias spring 56 in the previous embodiments. The latch plate 54 is composed of a flexible metal which compresses under force and returns to its original form when the force is removed. The latch plate 54 with the self contained bias spring in its relaxed state is in the engaged position. When the plunger 52 is drawn into the coil so, the latch plate 54 is compressed or flexed such that the seat end engaging the trip lever 18 moves toward the coil 50 allowing the trip lever 18 to slide from its latched to tripped position interrupting the circuit FIG. 6a shows one embodiment of the latch plate 54 functioning as a self contained spring. The latch plate 54 has a U-shaped portion 70 positioned between the grooved end of the plunger 52 and the coil housing 58. When the latching mechanism is in the engaged position, the U-shaped portion 70 in a relaxed state maintaining the engagement between the latch plate 54 and trip lever 18. When the plunger 52 is drawn into the coil 50, the U-shaped portion 70 of the latch plate 54 compresses. The motion of the plunger pulls the seat end of latch plate 54 to the right, causing the trip lever 18 to slide off the latch plate 54 and open the circuit.

FIGS. 6b and 6c illustrate an alternative embodiment of the latch plate 54 with the self contained spring. In this embodiment, the self contained spring is an L-shaped portion of the latch plate with its leg 72 turned away from the trip lever 18. When the latching mechanism is in the engaged position, the leg 72 is in a relaxed state maintaining the engagement between the latch plate 54 and the trip lever 18 as shown in FIG. 6b. In FIG. 6c, the coil 50 pulls the plunger/latch plate assembly 52 and 54 to the right flexing the leg 72 and moving the seat end of the latch plate 54 to the right. Because of the motion of the seat end of the latch plate 54 toward the coil, the trip lever 18 slides off its seat on the latch plate 54 opening the circuit.

Figure 7:
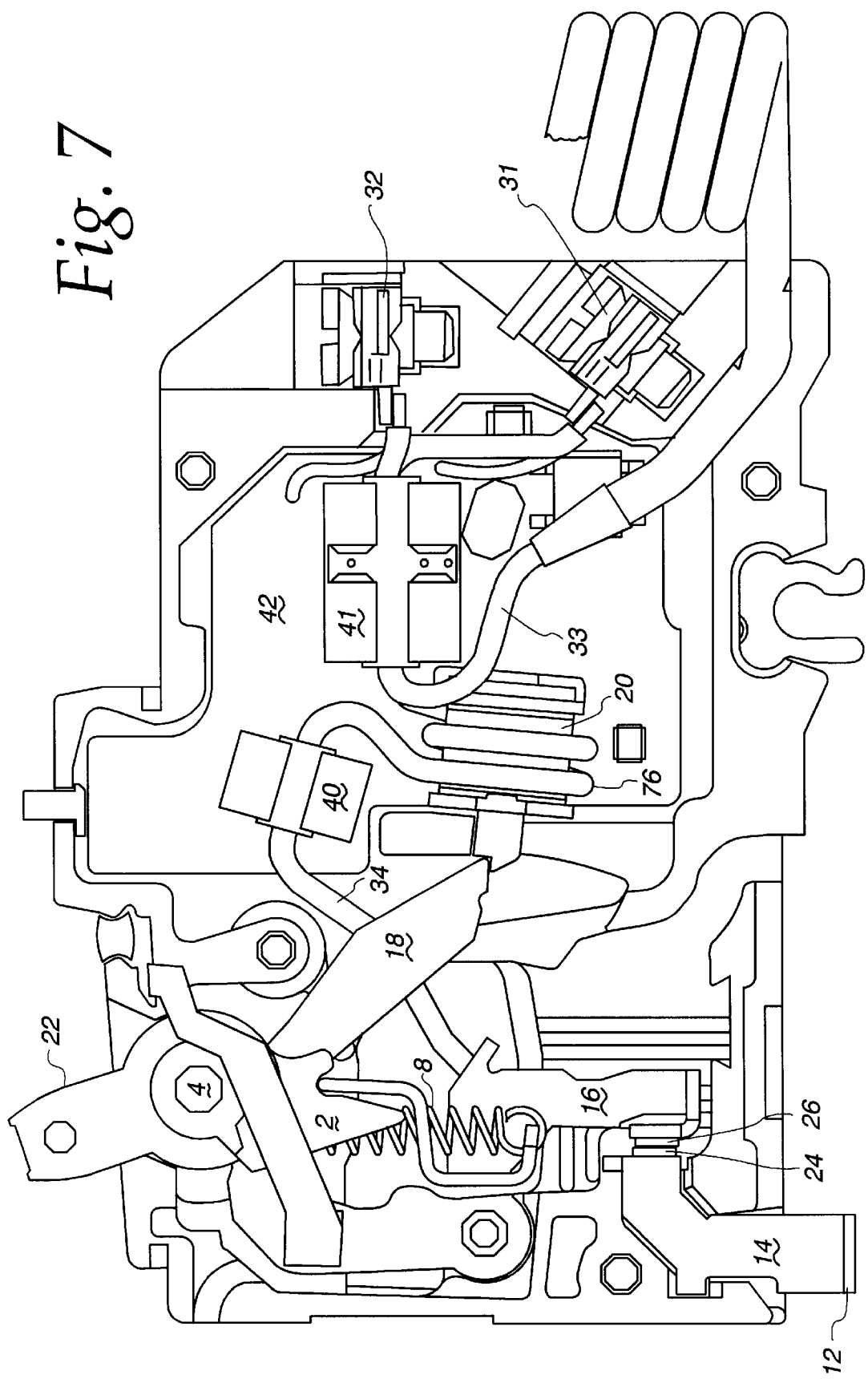
FIG. 7 is a plan view of an electronically controlled circuit breaker with integrated latch tripping including a high magnetic tripping conductor loop according to another embodiment of the present invention.

FIG. 7 illustrates a modified embodiment of the circuit breaker having the line conductor 34 wrapped around the latching mechanism 20 as a loop 76 for high magnetic tripping. When the current through the circuit breaker rises to a high level, i.e., above a preselected level, the current in the loop 76 produces a magnetic field that pulls the plunger 52 into the coil 50. The movement of the plunger 52 into the coil 50 opens the circuit as described in detail above. The high magnetic tripping of the circuit breaker occurs as soon as the current through the line conductor 32 passes the threshold level.

Figure 8:
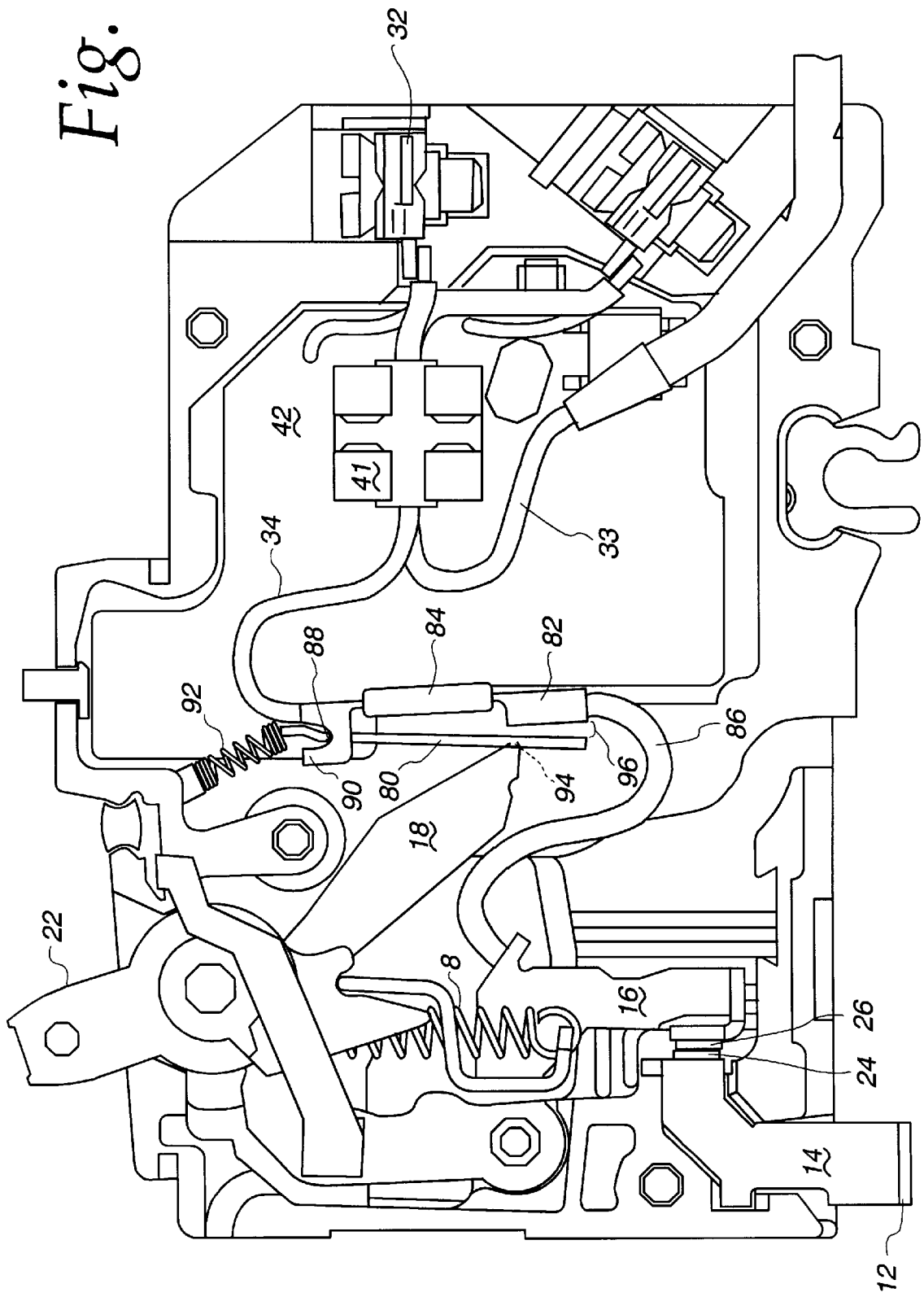
FIG. 8 is a plan view of an electronically controlled circuit breaker with integrated latch tripping comprising a trip coil, armature and yoke according to another embodiment of the present invention.

FIG. 8 shows a similar embodiment of the electronically controlled circuit breaker with integrated latch tripping as in FIG. 1. In FIG. 8, the latching mechanism 20 consists of an armature 80, yoke 82 and a trip coil 84 wrapped around the yoke 82. The current path in this embodiment passes from the moveable contact carrier 16 through a flexible conductor 86 (or pigtail) which connects the current path to a yoke 82, which, in turn, is electrically connected to the line conductor 34. FIG. 8 illustrates an embodiment of the circuit breaker 10 with a ground fault detection sensor 41. Other embodiments are contemplated including arcing fault and overcurrent detection circuitry.

As disclosed above, the ground fault sensor 41 in FIG. 8 senses the imbalance of current flow between the line and neutral conductors 34 and 33. When the trip circuit determines the presence of a ground fault, a trip signal is sent to the trip coil 84. The trip coil 84 is energized by the trip signal in the same manner as the coil was energized as disclosed above. The energized trip coil 84 generates a magnetic field about the yoke 82. In the preferred embodiment, the trip coil 84 has wrappings to produce a magnetic field of approximately 1500 A turns.

The armature 80 is pivotally cradled at its upper end 88 in the arms 90 of the yoke 82. An air gap 96 separates the armature 80 from the yoke 82. An armature spring 92 resiliently restrains the armature 80 from swinging relative to the yoke 82. When the latching mechanism is in the engaged position, the trip lever 18 engages the armature by resting on a seat 94 notched into the armature 80. When the trip coil 84 produces a magnetic field, the armature 80 is drawn toward the yoke 82 causing the armature 80 to swing counterclockwise closing the air gap 96 moving the latching mechanism to its released position. When the armature 80 swings to the right, the trip lever 18 is released from its seat 94 on the armature 80. As disclosed above, the trip lever 18 swings clockwise to open the circuit.

The circuit breaker may be reset in its traditional fashion. With the circuit open, a trip signal is no longer sent to the trip coil 84, so the magnetic field dissipates and the armature 80 returns to its engaged position. A user manually moves the handle 22 to the typical reset position, rotating the trip lever 18 counterclockwise. The trip lever 18 engages the armature 80 moving it toward the yoke 82. When the trip lever 18 reaches its upper position, the trip lever 18 returns to its seat 94 on the armature 80 resetting the trip lever in its latched position and resetting the circuit breaker.

While particular embodiments and applications of the present invention have been illustrated and described, it is to be understood that the invention is not limited to the precise construction and compositions disclosed herein and that various modifications, changes, and variations will be apparent from the foregoing descriptions without departing from the spirit and scope of the invention as defined in the appended claims.

What is claimed is:

1. A circuit breaker for interrupting an electrical current in a branch circuit of an electrical distribution system, said circuit breaker comprising:

a pair of breaker contacts for opening and closing an electrical power distribution circuit, a trip mechanism connected to at least one of said contacts for opening and closing said contacts, a plurality of sensors coupled to said power distribution circuit for sensing the electrical current in said power distribution circuit, the sensors producing respective output signals each representing a characteristic of said current, a plurality of separate electronic detectors each receiving a different one of the respective output signals, a first one of the detectors detecting occurrences of overload faults, a second one of the detectors detecting occurrences of ground faults and a third one of the detectors detecting occurrences of arcing faults, said detectors producing respective trip signals in response to such occurrences, and an actuator for actuating said trip mechanism to open said contacts in response to said trip signals.

2. The circuit breaker of claim 1 wherein said circuit breaker is a non-industrial miniature circuit breaker.

3. The circuit breaker of claim 1 wherein said actuator is electromagnetically coupled directly to said power distribution circuit for responding immediately to an overload fault producing a current above a preselected level.

4. The circuit breaker of claim 1 wherein said actuator is a solenoid having a coil and a plunger concentric with said coil, said coil receiving said trip signal, and said plunger cooperating with said trip mechanism for latching and releasing said trip mechanism.

5. The circuit breaker of claim 1 wherein said plurality of separate electronic detectors includes means responsive to the current in said power distribution circuit for simulating the response of a conventional bimetallic strip sensor to a sustained overload fault.

6. The circuit breaker of claim 1 wherein said actuator comprises a single solenoid responsive to a trip signal produced in response to the occurrence of any of said overload fault, ground fault and arcing fault.

7. The circuit breaker of claim 6 which includes a line conductor looped around the coil of said solenoid for energizing said solenoid immediately in response to an overload fault producing a current above a preselected level in said line conductor.

8. The circuit breaker of claim 1 wherein the plurality of sensors includes an arcing fault sensor and a ground fault sensor electromagnetically coupled to the power distribution circuit and an overload sensor directly coupled to the power distribution circuit, the arcing fault sensor being coupled to a line conductor of the power distribution circuit and producing an output signal that is supplied to said third detector, the ground fault sensor being coupled simultaneously to a line and neutral conductor of the power distribution circuit and producing an output signal that is supplied to said second detector, the overload sensor comprising a portion of the first detector and producing an output signal that is supplied to the first detector.

9. The circuit breaker of claim 1 wherein the trip mechanism comprises:
   a releasably latchable trip lever movable between a latched position and a tripped position, said electrical current adapted to flow through said circuit breaker when said trip lever is in said latched position, said electrical current being interrupted when said trip lever is moved to said tripped position; and
   a latching mechanism moveable between an engaged position and a released position in response to receiving a trip signal, said latching mechanism being adapted to engage said trip lever in said latched position when in said engaged position, said trip lever being adapted to move from said latched position to said tripped position when said latching mechanism is moved to said released position.

10. The circuit breaker of claim 9 further including a line terminal, a line conductor and a load terminal, said electrical current flowing from said line terminal through said line conductor to said load terminal, a first one of said plurality of sensors being wrapped around said line conductor to monitor a rate-of-change of the electric current in said line conductor and to produce a signal representing said rate-of-change, the detector, for detecting arcing faults, being electrically connected to said first sensor to receive said rate-of-change signal and to produce said trip signal in response to said rate-of-change signal having characteristics of an arcing fault.

11. The circuit breaker of claim 9 further including a line terminal, a line conductor, a neutral conductor and a load terminal, said electrical current flowing from said line terminal through said line conductor to said load terminal, a second one of said sensors being wrapped around said line conductor and said neutral conductor to sense an imbalance of current flow between said line conductor and said neutral conductor and to produce a signal representing said imbalance of current flow, the second detector, for detecting ground faults, being electrically connected to said second sensor to receive said imbalance of current flow signal and to produce said trip signal in response to said imbalance of current flow signal having characteristics of a ground fault.

12. The circuit breaker of claim 9 further including a line terminal, a line conductor, a load terminal and a trip circuit, said electrical current flowing from said line terminal through said line conductor to said load terminal, said trip circuit taking a plurality of current samples from said line conductor and creating an accumulation of a square of said current samples, wherein said trip circuit produces said trip signal when said accumulation is greater than a predetermined threshold characterizing an overcurrent.

13. The circuit breaker of claim 9 wherein said-latching mechanism includes a moveable plunger and a coil, the plunger being adapted for movement relative to the coil in response to movement of said latching mechanism between said engaged and released positions, said coil creating a magnetic field when said latching mechanism is moved from said engaged position to said released position, the plunger having a first position in the coil when said latching mechanism is in said engaged position, the plunger being moved from said first position toward a second position further into the coil in response to creation of the magnetic field.

14. The circuit breaker of claim 13 further including a line terminal, a line conductor and a load terminal, said electrical current flowing from said line terminal through said line conductor to said load terminal, said line conductor forming a plurality of loops around said coil, a magnetic field being generated by said loops when said electric current increases above a threshold, said plunger being adapted to move into said coil in response to said magnetic field moving the latching mechanism from said engaged position to said released position.

15. The circuit breaker of claim 13 wherein said latching mechanism further includes a moveable latch plate having a seat end and a interlocking end, said interlocking end interlocking with a distal end of the plunger, said seat end engaging the trip lever in said latched position when said latching mechanism is in said engaged position, said trip lever being adapted to slide off said seat end in response to the plunger being moved into the coil.

16. The circuit breaker of claim 15 wherein said latching mechanism further includes a bias spring surrounding the plunger and having a first and second end, said first end of said bias spring abutting the interlocking end of the latch plate and said second end of said bias spring abutting the coil, said bias spring biasing the seat end of the latch plate into engagement with the trip lever when said latching mechanism is in said engaged position, said bias spring being adapted to compress between the coil and the interlocking end of the latch plate in response to the plunger being moved into the coil.

17. The circuit breaker of claim 15 wherein the latch plate includes a smooth jacket encasing a core, said core interlocking with said distal end of said plunger, said smooth jacket providing a smooth seat for said trip lever on said seat end of said latch plate in said latched position, said trip lever being adapted to slide off said smooth seat and move into said tripped position in response to the plunger being moved into the coil.

18. The circuit breaker of claim 15 wherein the seat end of the latch plate is smooth and rounded to provide a smooth seat for said trip lever on said seat end in said latched position, said trip lever being adapted to slide off said smooth seat and move into said tripped position in response to the plunger being moved into the coil.

19. The circuit breaker of claim 15 wherein the seat end of the latch plate is smooth and folded to provide a smooth seat for said trip lever in said latched position, said trip lever being adapted to slide off said smooth seat and move into said tripped position in response to the plunger being moved into the coil.

20. The circuit breaker of claim 15 wherein the interlocking end of the latch plate has a stop to limit the movement of the latch plate and the plunger, said stop abutting a breaker case when the latching mechanism is in the engaged position, said stop abutting the coil when the latching mechanism is in the released position.

21. The circuit breaker of claim 9 wherein said latching mechanism comprises a trip coil and a moveable armature, said movable armature seating said trip lever in said latched position when said latching mechanism is in said engaged position, said trip coil being adapted to create a magnetic field in response to said trip signal, said latching mechanism moving to said released position and said moveable armature releasing said trip lever in response to creation of the magnetic field.

22. The circuit breaker of claim 21 wherein said latching mechanism further includes a yoke, said trip coil being wrapped around said yoke and adapted to create said magnetic field around said yoke in response to said trip signal.

23. The circuit breaker of claim 13 wherein a distal end of said plunger seats the trip lever in the latched position when said latching mechanism is in said engaged position, said trip lever being adapted to slide off of said distal end and into said tripped position in response to the plunger being moved into said coil.

24. A circuit breaker for interrupting an electrical current in a branch circuit of an electrical distribution system, said circuit breaker comprising:

a pair of breaker contacts for opening and closing an electrical power distribution circuit, a trip mechanism connected to at least one of said contacts for opening and closing said contacts, said trip mechanism including a releasably latchable trip lever movable between a latched position and a tripped position, said electrical current adapted to flow through said circuit breaker when said trip lever is in said latched position, said electrical current being interrupted when said trip lever is moved to said tripped position; and a latching mechanism moveable between an engaged position and a released position in response to receiving a trip signal, said latching mechanism being adapted to engage said trip lever in said latched position when in said engaged position, said trip lever being adapted to move from said latched position to said tripped position when said latching mechanism is moved to said released position;

means for electronically generating a trip signal; and an actuator responsive to said trip signal for moving said latching mechanism between said engaged and released positions, wherein said latching mechanism includes a moveable plunger, a coil and a moveable latch plate having a seat end and a interlocking end, the plunger being adapted for movement relative to the coil in response to movement of said latching mechanism between said engaged and released positions, the coil creating a magnetic field when said latching mechanism is moved from said engaged position to said released position, the plunger having a first position in the coil when said latching mechanism is in said engaged position, the plunger being moved from said first position toward a second position further into the coil in response to creation of the magnetic field, the interlocking end of the movable latch plate interlocking with a distal end of the plunger, the seat end of the latch plate having a first leg and a second leg defining a L-shape, said first leg providing a smooth seat for said trip lever in said latched position, said second leg being perpendicular to said first leg, the seat end of the movable latch plate engaging the trip lever in said latched position when said latching mechanism is in said engaged position, said trip lever being adapted to slide off said smooth seat and move into said tripped position in response to the plunger being moved into the coil.

25. A circuit breaker for interrupting an electrical current in a branch circuit of an electrical distribution system, said circuit breaker comprising:

a pair of breaker contacts for opening and closing an electrical power distribution circuit, a trip mechanism connected to at least one of said contacts for opening and closing said contacts, said trip mechanism including a releasably latchable trip lever movable between a latched position and a tripped position, said electrical current adapted to flow through said circuit breaker when said trip lever is in said latched position, said electrical current being interrupted when said trip lever is moved to said tripped position; and a latching mechanism moveable between an engaged position and a released position in response to receiving a trip signal, said latching mechanism being adapted to engage said trip lever in said latched position when in said engaged position, said trip lever being adapted to move from said latched position to said tripped position when said latching mechanism is moved to said released position;

means for electronically generating a trip signal; and an actuator responsive to said trip signal for moving said latching mechanism between said engaged and released positions, wherein said latching mechanism includes a moveable plunger, a coil and a flexible latch plate having a seat end and a interlocking end, the plunger being adapted for movement relative to the coil in response to movement of said latching mechanism between said engaged and released positions, said coil creating a magnetic field when said latching mechanism is moved from said engaged position to said released position, the plunger having a first position in the coil when said latching mechanism is in said engaged position, the plunger being moved from said first position toward a second position further into the coil in response to creation of the magnetic field, said flexible latch plate having a relaxed position and a flexed position, said interlocking end of said latch plate interlocking with a distal end of the plunger, said seat end of said latch plate seating the trip lever in said latched position when said flexible latch plate is in said relaxed position, said trip lever being adapted to slide off said seat end of said latch plate in response to said flexible latch plate flexing into said flexed position when the plunger is moved into said coil.

26. The circuit breaker of claim 25 wherein the latch plate has a U shaped end for interlocking with the distal end of the plunger, said U-shaped end having a first leg and a second leg, said first leg interlocking with the distal end of the plunger, said second leg abutting the coil, said U-shaped end being movable between a relaxed position and a flexed position, the U-shaped end biasing said latch plate into engagement with said trip lever when in said relaxed position and compress between said plunger and said coil when in said flexed position.

27. The circuit breaker of claim 25 wherein the distal end of the latch plate comprises a first leg and a second leg movable relative to the trip lever between a relaxed position and a flexed position, said first leg abutting a breaker case, said second leg interlocking with said plunger, said first and second legs meeting at approximately a right angle and defining a seat for said trip lever when in said relaxed position, said first and second legs meeting at an obtuse angle and releasing said trip lever from said seat when in said flexed position.

* * * * *